United States Patent [19]

Althouse et al.

[11] Patent Number: 5,769,237

[45] Date of Patent: Jun. 23, 1998

[54] TAPE CARRIER FOR ELECTRONIC AND ELECTRICAL PARTS

[75] Inventors: Victor E. Althouse, Los Altos; Christopher E. Brodie, Mountain View, both of Calif.

[73] Assignee: Vichem Corporation, Sunnyvale, Calif.

[21] Appl. No.: 680,390

[22] Filed: Jul. 15, 1996

[51] Int. Cl.⁶ .................................................. B65D 85/30
[52] U.S. Cl. ......................... 206/714; 206/460; 206/813
[58] Field of Search .................................. 206/701, 713, 206/714, 715, 716, 460, 813

[56] References Cited

U.S. PATENT DOCUMENTS

| | | |
|---|---|---|
| 2,885,849 | 5/1959 | Wohlman, Jr. . |
| 3,177,629 | 4/1965 | Anspach . |
| 3,608,711 | 9/1971 | Wiesler et al. .................. 206/714 |
| 3,971,193 | 7/1976 | Tardiff et al. . |
| 4,298,120 | 11/1981 | Kaneko et al. . |
| 4,406,367 | 9/1983 | Bouwknegt . |
| 4,575,995 | 3/1986 | Tabuchi et al. . |
| 4,667,944 | 5/1987 | Althouse . |
| 4,711,014 | 12/1987 | Althouse . |
| 4,724,954 | 2/1988 | Sillner . |
| 4,778,326 | 10/1988 | Althouse et al. . |
| 4,954,207 | 9/1990 | Higuchi et al. . |
| 4,966,282 | 10/1990 | Kawanishi et al. . |
| 5,025,923 | 6/1991 | Okui . |
| 5,343,363 | 8/1994 | Greeson et al. . |
| 5,524,765 | 6/1996 | Gutentag . |

OTHER PUBLICATIONS

Trade Brochure entitled "Shin–Etsu Electro–Pack Carrier Tape" published by Shin–Etsu Polymer Co. Ltd.

*Primary Examiner*—Jacob K. Ackun

[57] ABSTRACT

A carrier tape for electronic or electrical devices which contains a support film containing pockets and, within each of the pockets, a fastening layer having a fixed portion which is attached to the floor of the pocket and a release portion which is composed of a flexible polymeric film, preferably a soft elastomer film, and which can be deformed away from the floor without detaching the fixed portion from the floor. The devices are placed on the release portions of the fastening member.

20 Claims, 1 Drawing Sheet

TAPE CARRIER FOR ELECTRONIC AND ELECTRICAL PARTS

BACKGROUND OF THE INVENTION

1. Field of the Invention

This invention relates to tape carriers for electronic and electrical devices, including semiconductor chips.

2. Introduction to the Invention

When electronic and electrical devices are to be supplied to a desired location, it is conventional to make use of a tape carrier comprising spaced-apart pockets, with one device in each pocket. Such pocketed tapes are sometimes referred to as "embossed" tapes. The tape carrier often has sprocket holes on one or both edge portions so that it can be handled in a controlled manner. Ordinarily, the pockets are formed in the tape, and a cover tape, and/or a mechanical retaining member in the pocket, and/or a pressure-sensitive adhesive (PSA) at the bottom of the pocket, are used to retain the electronic device in the pocket until it is removed, e.g. by means of a vacuum tool. In some cases, the pocket has a hole in the bottom so that an ejector pin can be pushed through the hole to eject the device. These known carrier tapes have one or more of a number of disadvantages. For example, different carriers are usually needed for different devices, since the pockets and the mechanical retaining members must be customized to particular devices, to ensure that the device does not fall out of the pocket and remains in a desired location and orientation in the pocket. Use of PSAs suffers from the disadvantage that some of the adhesive may stick to the device, after it has been removed from the carrier; another disadvantage is that the level of adhesion can change with time and/or ambient conditions, with removal of the device generally becoming more difficult with time. Use of an ejector pin can damage the device if the contact force is excessive. In a variation of the "pocketed tape", apertures are punched in a tape and the apertures are converted into pockets by means of one or more strips of a PSA tape longitudinally bonded to the bottom of the punched tape. Punched tapes of this kind suffer from the disadvantage that the PSA tape does not afford good mechanical protection to the device, and the other disadvantages of the PSAs referred to above.

SUMMARY OF THE INVENTION

We have discovered, in accordance with the present invention, that a very satisfactory carrier tape for electronic and electrical devices comprises (a) a carrier member which comprises a pocketed support film and (b) a fastening member in each of the pockets, the fastening member comprising a flexible polymeric film which is selectively secured to the floor of the pocket.

In a first preferred aspect, this invention provides a tape carrier for electronic and electrical devices, the carrier comprising (1) a flexible support film which
  (a) is composed of a polymeric material, and
  (b) comprises (i) two longitudinally extending edge portions, and (ii) a longitudinally extending central portion which lies between the edge portions and which comprises a plurality of spaced-apart pockets, each of the pockets having a floor; and (2) within each of the pockets, a fastening member which comprises
  (a) a fixed portion which is attached to the floor of the pocket, and
  (b) a release portion which is composed of a flexible polymeric film and which can be deformed away from the floor without detaching the fixed portion from the floor.

The term "without detaching the fixed portion (of the fastening member) from the floor" is used herein to mean that at least a part of the fixed portion of the fastening member remains attached to the floor of the pocket. Thus the invention includes the possibility that when the release portion of the fastening member is deformed away from the floor, parts of the fixed portion adjacent the release portion are also deformed away from the floor.

In a second preferred aspect, this invention provides an assembly of electronic or electrical devices, the assembly comprising a tape carrier according to the first preferred aspect of the invention and a plurality of electronic devices positioned on release portions of the fastening members.

In a third preferred aspect, this invention provides a method of making a carrier tape according to the first preferred aspect of the invention, the method comprising (A) providing a tape member which comprises a flexible support film which
  (a) is composed of a polymeric material, and
  (b) comprises (i) two longitudinally extending edge portions, and (ii) a longitudinally extending central portion which lies between the edge portions and which comprises a plurality of spaced-apart pockets, each of the pockets having a floor; and
(B) placing a fastening member on the floor of each of the pockets so that the fastening member comprises (i) a fixed portion which is attached to the floor of the pocket and (ii) a release portion which can be deformed away from the floor: without detaching the fixed portion from the floor.

BRIEF DESCRIPTION OF THE DRAWING

The invention is illustrated in the accompanying drawing, in which.

DETAILED DESCRIPTION OF THE INVENTION

Figure 1:
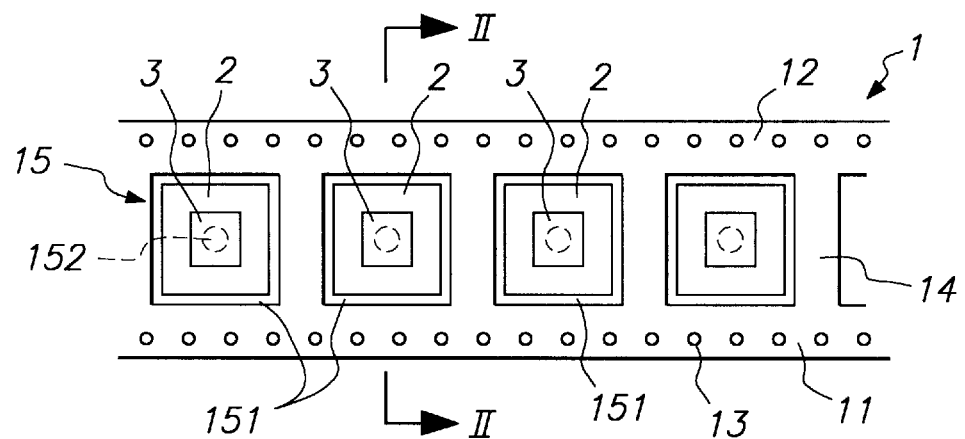
FIG. 1 is a diagrammatic plan view of an assembly of the invention.

In the description below, reference will be made to a number of specific features of the apparatus and methods of the invention. It is to be understood that these features, even if described in a particular context, e.g. as part of one of the Figures, can be used in any apparatus of the invention, either individually or in any appropriate combination.

The support film must be one in which pockets can be formed, preferably by a conventional thermoforming or pressure forming process. Subject to this requirement, a wide variety of polymeric films can be used as the support film. The film can have one or more layers of the same or different polymers. One or more of the layers can contain a conductive filler, e.g. carbon black, so that it is electrically conductive and provide electrostatic discharge (ESD) protection. Suitable polymers include polystyrenes and polycarbonates, as well as polyesters, polyamides, polyimides, polyolefins, polyketone, polyetherimides, fluoropolymers, and polyvinyl chloride.

The thickness of the support film, where it has not been stretched by the pocket forming process, is generally 0.001 to 0.020 inch, preferably 0.001 to 0.016 inch. The support film will generally have sprocket holes along one or both edge portions thereof. However, the invention includes the possibility that the assembly is handled without the need for sprocket holes. Each of the pockets will generally have an aperture in its floor, e.g. a circular hole in the middle of the floor or a rectangular aperture running transversely or longitudinally across the pocket, so that an ejector pin can be used to deform the fastening layer so that the device can be removed from the pocket. Alternatively or additionally, the device can be grasped, e.g. with a vacuum tool or with tweezers, and pulled upwards, thus deforming the release portion of the fastening layer and reducing the adhesive forces between the fastening layer and the device, so that the device can be removed from the pocket. Thus, the invention includes the possibility that there is no hole in the floor of the pocket.

The fastening member comprises a fixed portion and a release portion. The fixed portion is attached to the floor of the pocket more securely than the release portion, so that it is possible to deform the release portion away from the floor of the pocket without detaching the fixed portion from the floor. The release portion may not be attached to the floor at all, and at least part of it will not be attached to the floor when, as is preferred, there is an aperture in the floor. The floor or the fastening member or both can be treated so as to promote adhesion between them in the fixed portion and/or to lessen adhesion between them in the release portion. For example there can be, between the floor and the fastening member, an adhesive in the fixed portion and/or a release layer in the release portion. Preferably, the fixed portion is a peripheral portion, particularly a continuous peripheral portion, and the release portion is a central portion.

The fastening member is preferably formed in the pocket by casting a polymer therein. If the floor of the pocket has an aperture therein, a backing member is placed to cover the apertures (on the side remote from the pocket) before casting the polymer. The backing member will usually be removed before the tape carrier is used. Alternatively, the fastening member can be formed separately and then placed in the pocket. The fastening member can be the same size as, or smaller than, the floor of the pocket.

In preferred embodiments of the invention, the fastening member is composed of a soft elastomer so that the fixed portion will adhere to the floor of the pocket without any additional retaining means, e.g. adhesive, and so that the device will adhere to the upper side of the fastening member without any additional retaining means. However, it is also possible to use a film of a polymer which is wholly or partially coated on one or both sides with a pressure-sensitive adhesive (PSA).

The elastomer preferably has a hardness which is from 20 on the Shore 00 scale to 70 on the Shore A scale, particularly 50 on the Shore 00 scale to 60 on the Shore A scale, especially 15 to 50, e.g. 20 to 50, on the Shore A scale. Suitable elastomers include polysiloxanes, polyurethanes, various thermoplastic elastomers (urethanes, styrenes, olefinics, copolyesters, alloys and polyamides) and other melt-processable or solvent-processable rubbers. The thickness of the fastening member is generally 0.0005 to 0.025 inch, preferably 0.001 to 0.015 inch, particularly 0.001 to 0.006 inch. When the elastomer has a hardness of 15 to 50, e.g. 20 to 50, on the Shore A scale, the fastening member preferably has a thickness of 0.001 to 0.010 inch, particularly 0.002 to 0.006 inch.

The Devices

The invention is particularly useful for handling small electronic devices, particularly flat devices such as semiconductor chips, both bare and packaged; other suitable devices include flip chips, ball grid arrays (BGAs) and some chip scale packages (CSPs) which use solder bumped technology. Fine pitch lead devices and other non-planar devices can also be handled, if the pockets in the carrier tape are suitably formed. Other electrical and non-electrical components can also be used. The thickness of the device is preferably less than 0.25 inch. The area of the device is preferably less than 3 inch. The size of the pocket can be substantially larger than the device, e.g. up to 4 inch, for example 0.5 to 2.25 $inch^2$, preferably 0.8 to 1.2 $inch^2$, making it possible to use the same tape carrier for a wide variety of different devices. The device should be placed on the fastening member so that at least part of it lies on the release portion. In many cases, part of the device lies on the fixed portion.

Cover Films

If desired in order to provide environmental protection, the carrier tape having the devices in the pockets thereof can be covered by a cover film which is lightly secured to the support film between and around the pockets. The cover film is of course removed before the devices are taken out of the pockets. A wide variety of polymeric films can be used as the cover film. Suitable polymers include polyethylene and the other polymers specified above for the support film, and in addition polyvinyl acetate and cellulosic polymers. The thickness of the cover film is generally 0.0005 to 0.020 inch, preferably 0.001 to 0.003 inch.

When the release portion of the fastening member is deformed away from the pocket, this tends to peel it away from the device, so that the device can be easily removed therefrom. Preferably, the deformation is caused at least in part by an ejector pin which is pushed upwards through an aperture in the floor of the pocket. The fastening member cushions the device from the ejector pin and reduces the danger of damaging the device.

Referring now to the drawing, this shows an assembly of the invention comprising a flexible support film 1 which comprises two longitudinally extending edge portions 11,12 having sprocket holes 13 therein and a longitudinally extending central portion 14. In the central portion 14 there are spaced-apart pockets 15. Each pocket has a floor 151 with an aperture 152 in its center. On the floor of each pocket there is a fastening member 2 which is composed of a soft elastomer and which comprises a peripheral portion 21 attached to the floor of the pocket and a release portion 22 which overlies the aperture 152. A device 3 lies on the upper side of the fastening member 2. The fastening member has sufficient adhesive character to hold the device firmly in place during normal handling and storage of the carrier tape. However, when an ejector pin is pushed upwards through the aperture, the release portion of the fastening member is deformed away from the floor, thus reducing the contact area between the device and the fastening member, so that the device can be easily removed from the pocket, e.g. with a vacuum tool. A part of the fixed portion of the floor, around the aperture, may also separate from the floor. However, enough of the fixed portion should remain secured to the floor to ensure that the fastening member remains secured to the pocket. Preferably, the deformation of the fastening member is elastic, so that when the ejector pin is withdrawn the fastening member returns to its flat configuration, ready for reuse.

The invention is illustrated by the following Example.

EXAMPLE

Figure 2:
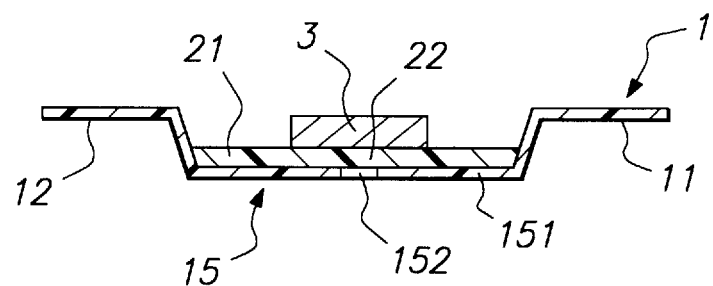
FIG. 2 is a diagrammatic enlarged cross-section on line II—II through the assembly of FIG. 1, the thicknesses of the components being exaggerated for clarity.

A tape carrier as shown in FIGS. 1 and 2 was prepared as follows.

A tape carrier available from Advantek Inc. as Part No. BGA 225-AC was used as the flexible support film. The film is described in detail in a Certificate of Compliance dated Nov. 9, 1994. The film is about 45 mm wide and the pockets in it are about 27.6 mm square and are separated by about 4 mm. In the center of the floor of each pocket there, is a small hole. The film is believed to be a laminate of two or more layers, at least one of the layers being polystyrene filled with carbon black to render it conductive.

A polysiloxane sold under the tradename Sylgard 184 was cast as a film about 0.006 inch (0.15 mm) thick and cured at 65° C. overnight. Samples about 25 mm square were cut from the cast film, and one of the samples was placed in each of the pockets of the support film. The samples conformed and adhered to the pockets, thus producing a fastening member in each pocket. A semiconductor device, about 12 mm square and about 0.6 mm thick, was placed centrally on each of the fastening members. The devices adhered well to the fastening members, and did not move even during severe movement of the tape carrier. When an ejector pin was pushed through the hole in the floor of the pocket, the fastening member deformed, thus lessening the bond between the fastening member and the device, so that the device could be easily removed with a vacuum tool. After removal of the ejector pin, the fastening member returned to its previous flat configuration, so that the carrier tape could be reused.

We claim:

1. A tape carrier for electronic and electrical devices, the carrier comprising
    (1) a flexible support film which
        (a) is composed of a polymeric material, and
        (b) comprises (i) two longitudinally extending edge portions, and (ii) a longitudinally extending central portion which lies between the edge portions and which comprises a plurality of spaced-apart pockets, each of the pockets having a floor; and
    (2) within each of the pockets, a fastening member which comprises
        (a) a fixed portion which is attached to the floor of the pocket, and
        (b) a release portion which is composed of a flexible polymeric film and which is either attached to said floor less securely than said fixed portion, or is not attached to said floor, such that said release portion can be deformed away from the floor without detaching the fixed portion from the floor.

2. A tape carrier according to claim 1 wherein the fastening member is a film of an elastomer.

3. A tape carrier according to claim 1 wherein the fastening member is a film which is 0.0005 to 0.025 inch thick and is composed of an elastomer having a hardness between 20 on the Shore 00 scale and 70 on the Shore A scale.

4. A tape carrier according to claim 1 wherein the fastening member is a film which is 0.001 to 0.010 inch thick and is composed of an elastomer having a hardness between 15 on the Shore A scale and 50 on the Shore A scale.

5. A tape carrier according to claim 4 wherein the film is 0.002 to 0.006 inch thick.

6. A tape carrier according to claim 4 wherein the support film is composed of polystyrene or a polycarbonate and the elastomer is a polysiloxane.

7. A tape carrier according to claim 1 wherein there is an aperture in the floor of the pocket underneath the release portion of the fastening member.

8. A tape carrier according to claim 1 wherein the fixed portion is a peripheral portion and the release portion is a central portion.

9. An assembly of electronic or electrical devices, the assembly comprising
    (1) a flexible support film which
        (a) is composed of a polymeric material, and
        (b) comprises (i) two longitudinally extending edge portions, and (ii) a longitudinally extending central portion which lies between the edge portions and which comprises a plurality of spaced-apart pockets, each of the pockets having a floor,
    (2) within each of the pockets, a fastening member which comprises
        (a) a fixed portion which is attached to the floor of the pocket, and
        (b) a release portion which is composed of a flexible polymeric film and which is either attached to said floor less securely than said fixed portion, or is not attached to said floor, such that said release portion can be deformed away from the floor without detaching the fixed portion from the floor; and
    (3) a plurality of electronic devices positioned on release portions of the fastening members.

10. An assembly according to claim 9 wherein the fastening member is a film which is 0.001 to 0.0010 inch thick and is composed of an elastomer having a hardness between 15 on the Shore A scale and 50 on the Shore A scale.

11. An assembly according to claim 10 wherein there is an aperture in the floor of the pocket underneath the release portion of the fastening member.

12. An assembly according to claim 10 wherein the fixed portion is a peripheral portion and the release portion is a central portion.

13. A method of making a carrier tape as defined in claim 1 which comprises
    (1) providing a tape member which comprises a flexible support film which
        (a) is composed of a polymeric material, and
        (b) comprises (i) two longitudinally extending edge portions, and (ii) a longitudinally extending central portion which lies between the edge portions and which comprises a plurality of spaced-apart pockets, each of the pockets having a floor; and
    (2) placing a fastening member on the floor of each of the pockets so that the fastening member comprises
        (a) a fixed portion which is attached to the floor of the pocket, and
        (b) a release portion which is composed of a flexible polymeric film and which is either attached to said floor less securely than said fixed portion, or is not attached to said floor, such that said release portion can be deformed away from the floor without detaching the fixed portion from the floor.

14. A method according to claim 13 wherein the floor of each pocket has an aperture therein, a backing member covers the apertures on the side of the tape member remote from the pocket, and the fastening member is formed by casting a polymer on the floor of each pocket.

15. A method according to claim 13 wherein the floor of each pocket has a release coating on a selected area thereof, and the fastening member is formed by casting an elastomer on the floor of each pocket.

16. A method of processing electronic or electrical devices which comprises
    (A) providing an assembly of electronic or electrical devices as claimed in claim 9;
    (B) advancing said assembly through a work station;
    (C) sequentially subjecting the release portion of each of the fastening layers to forces which deform the release portion away from the floor of the pocket; and (D) sequentially removing the devices from the deformed release portions.

17. A method according to claim 16 wherein the floor of each of the pockets has an aperture therein, and the method includes pushing an ejector pin upwards through the aperture to deform the release portion of the fastening layer.

18. A tape carrier according to claim 1 wherein the pockets in the support film have been formed by thermoforming or pressure forming a film having a thickness of 0.001 to 0.020 inch.

19. An assembly according to claim 9 wherein the pockets in the support film have been formed by thermoforming or pressure forming a film having a thickness of 0.001 to 0.020 inch.

20. A method according to claim 13 wherein the pockets in the support film have been formed by thermoforming or pressure forming a film having a thickness of 0.001 to 0.020 inch.

* * * * *